(12) United States Patent
Ingalz (10) Patent No.: US 7,233,501 B1
(45) Date of Patent: Jun. 19, 2007

(54) INTERLEAVED MEMORY HEAT SINK

(75) Inventor: Charles J. Ingalz, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 280 days.

(21) Appl. No.: 10/939,198

(22) Filed: Sep. 9, 2004

(51) Int. Cl.
*H05K 7/00* (2006.01)

(52) U.S. Cl. ............... 361/760; 361/704; 361/702; 361/697

(58) Field of Classification Search ............... 361/704, 361/753, 794, 816, 818, 697, 702, 760, 709; 165/80.3, 80.4, 104.33; 257/713, 715
See application file for complete search history.

(56) References Cited

U.S. PATENT DOCUMENTS

| | | | | |
|---|---|---|---|---|
| 5,444,304 A * | 8/1995 | Hara et al. | ............... | 257/796 |
| 5,535,816 A * | 7/1996 | Ishida | ............... | 165/80.3 |
| 6,165,612 A * | 12/2000 | Misra | ............... | 428/344 |
| 7,079,396 B2 * | 7/2006 | Gates et al. | ............... | 361/719 |
| 2006/0060328 A1 * | 3/2006 | Ewes et al. | | |

FOREIGN PATENT DOCUMENTS

KR     2003-0078301     * 10/2003

* cited by examiner

*Primary Examiner*—Tuan Dinh
*Assistant Examiner*—Yuriy Semenenko
(74) *Attorney, Agent, or Firm*—Martine Penilla & Gencarella, LLP (57) ABSTRACT

A heat sink comprises a heat sink base and a row of heat sink extensions that are attached to one side of the heat sink base. An interleaved heat sink structure includes a first row and a second row of heat sink extensions. The first row and the second row of heat sink extensions are coupled respectively to a first and a second heat sink bases. The first and the second heat sink bases are thermally coupled to a first plurality of memory packages and a second plurality of memory packages, respectively. The first row of heat sink extensions is parallel to and at least partially interleaved with the second row of heat sink extensions. A memory heat dissipation control system and a method for assembly a memory part that includes a DIME and two heat sinks are also described.

26 Claims, 9 Drawing Sheets

INTERLEAVED MEMORY HEAT SINK

BACKGROUND OF THE INVENTION

1. Field of the Invention

The present invention relates generally to a heat sink, and more particularly, to an interleaved heat sink structure for dissipating heat from memory chips.

2. Description of the Related Art

Electronic storage medium, such as dynamic random access memory (DRAM), is frequently packaged in a way that allows for high density per unit of physical space. DRAM often dissipates heat as a part of normal operation and functions optimally within a temperature range. This is especially true given the recent proliferation of stacked, doubled sided DRAM dual inline memory modules (DIMMs) where the DRAM packages are stacked in a planar fashion, and where stacked DRAM packages are placed on both sides of a printed circuit board (PCB).

Figure 1A:
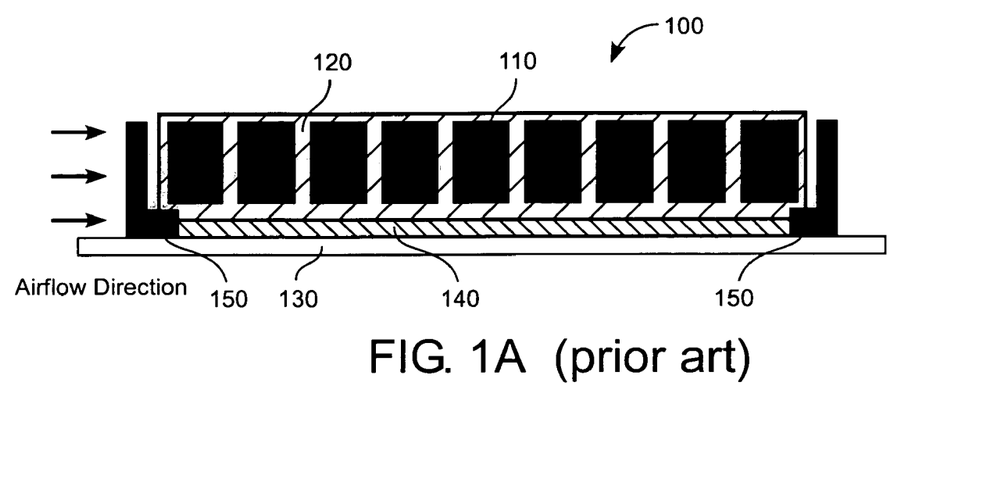
FIG. 1(a) illustrates a side view of a conventional dynamic random access memory (DRAM) dual inline memory module (DIMM).
Figure 1B:
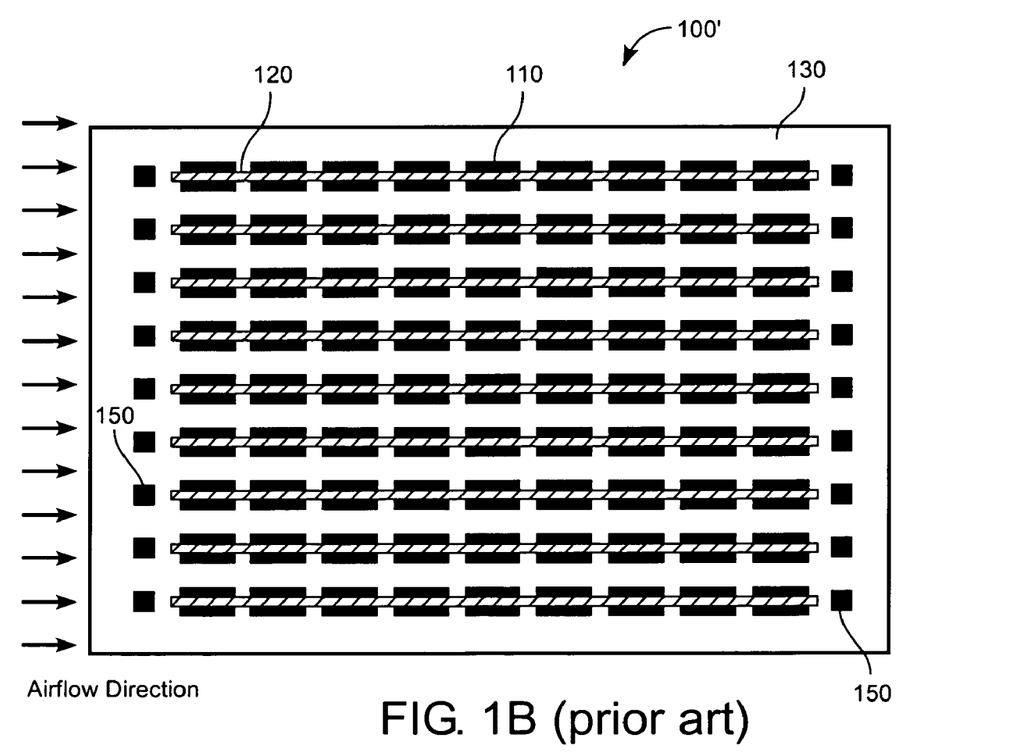
FIG. 1(b) illustrates a top view of a DRAM DIMM array.

FIG. 1(a) shows a side view of a conventional DRAM DIMM 100 that includes a plurality of DRAM packages 110 attached to both sides of a PCB 120. The DRAM DIMM 100 is plugged into a host board 130 through a DIMM socket 140 and is received by a pair of connectors 150. Multiple DRAM DIMMs are often placed on a host board in rows, columns, or both to maximize memory density in a given physical space. FIG. 1(b) illustrates a top view of a DRAM DIMM array 100' placed in rows on the host board 130. Each of the DRAM DIMMs is received by a pair of connectors 150.

As shown in FIG. 1(a) and FIG. 1(b), DRAM DIMMs can be actively cooled by transverse airflow. However, in a system where a DRAM DIMM array is placed on a host board in close proximity to each other, such as 12.7 mm, this creates a situation where the air must flow through narrow air channels between the DRAM DIMMs. Given that DRAM DIMMs are generally longer than the placement density of a DRAM DIMM array on a host board, the air channel between two DRAM DIMMs can be very narrow and long. As a result, a boundary layer is developed around each DRAM DIMM, which results in a stagnation of airflow near the DRAM DIMM surface.

Figure 2:
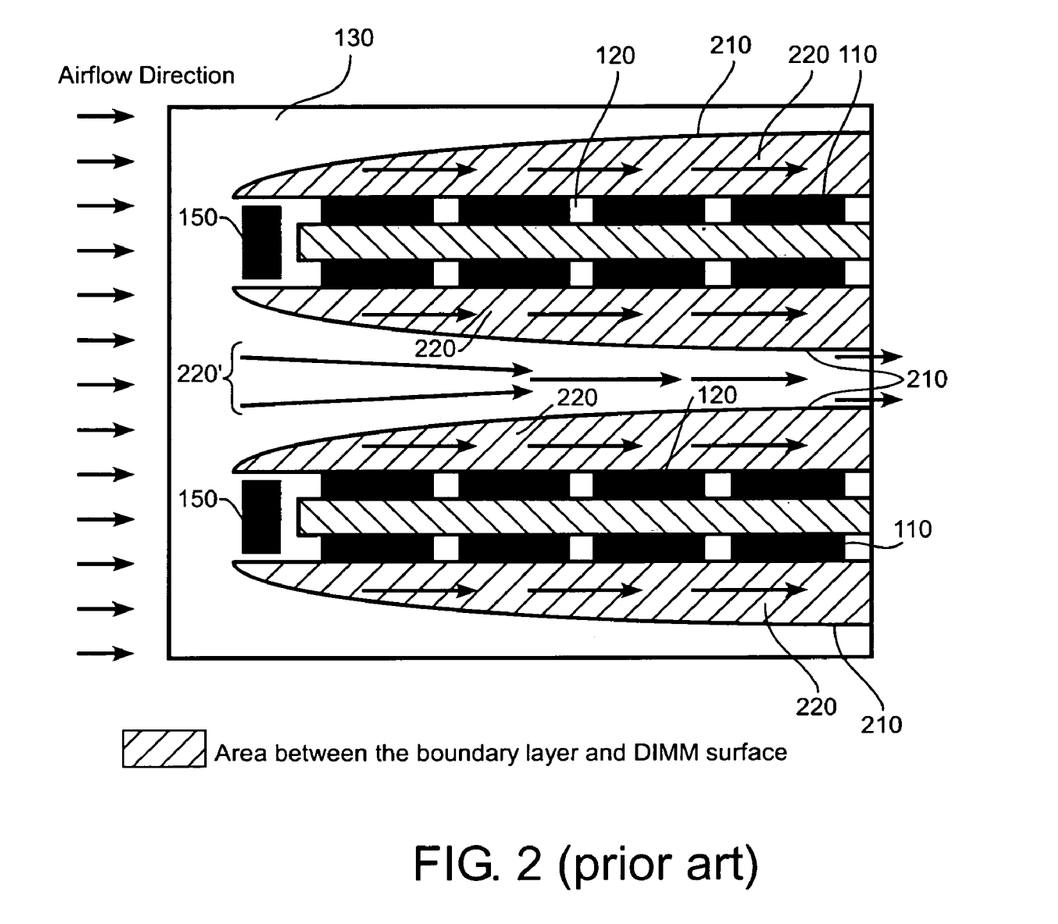
FIG. 2 illustrates the boundary layers formed around two DRAM DIMMs when airflow travels transversely through the narrow channel between the two DRAM DIMMs.

As illustrated in FIG. 2, when boundary layers 210 are formed around two DRAM DIMMs, the airflow in the areas 220 between the boundary layers 210 and the DRAM DIMM surfaces are slowed down, thus reducing the efficiency in which heat can be dissipated from the DRAM packages 110 of the PCBs 120. In this example, the airflow is actually more efficient between the areas 220, where it is less effective to cool the DRAM DIMM surfaces.

In order to solve the thermal challenges generated by a DRAM DIMM array, integrated metal heat spreaders, attached to the DRAM DIMM surfaces, can be used to assist with cooling. However, due to the boundary layer effect, the heat that gathers at the metal heat spreaders need to be directed to an area where more air is flowing, such as region 220'. Therefore, it would be useful to design a heat sink that can pass through the boundary layer. This, however, conflicts with achievable DRAM DIMM density because such a heat sink design would reduce the possible density in which DRAM DIMMs could be placed in an array since the heat sink would occupy space that could otherwise be occupied with a denser placement of DRAM DIMMs. If the heat sinks are placed in close proximity to each other, individual servicing, i.e., the individual vertical injection and ejection, of each DRAM DIMM in a DRAM DIMM array might be jeopardized.

In view of the foregoing, there is a need for a heat sink that will highly utilize the airflow between the DIMMs yet still allow high density and individual servicing of each DIMM in a DIMM array.

SUMMARY OF THE INVENTION

Broadly speaking, the present invention fills this need by providing an interleaved heat sink structure. A memory heat dissipation control system and a method of assembly a memory part that includes a DIMM and two heat sinks are also described.

In accordance with one aspect of the present invention, an interleaved heat sink structure for dissipating heat from memory is provided. The heat sink described in the present invention comprises a heat sink base and a row of heat sink extensions that are attached to one side of the heat sink base. The interleaved heat sink structure includes a first row and a second row of heat sink extensions. The first row and the second row of heat sink extensions are coupled respectively to a first and a second heat sink bases. The first and the second heat sink bases are thermally coupled to a first plurality of memory packages and a second plurality of memory packages, respectively. The first row of heat sink extensions is parallel to and at least partially interleaved with the second row of heat sink extensions.

In accordance with another aspect of the present invention, a memory heat dissipation control system is disclosed. The memory heat dissipation control system includes a host board for receiving a plurality of memory parts and a plurality of connectors arranged on the host board for receiving the memory parts. Each memory part comprises a printed circuit board (PCB), a first plurality of memory packages attached to a first side of the PCB, a second plurality of memory packages attached to a second side of the PCB, a first heat sink base, thermally coupled to the first plurality of the memory packages, having a first row of heat sink extensions facing opposite of the first plurality of memory packages, and a second heat sink base, thermally coupled to the second plurality of memory packages, having a second row heat sink extensions facing the opposite of the second plurality of memory packages. The first row of heat sink extensions of a memory part is offset from the second row of heat sink extensions of the memory part. Adjacent memory parts have the first row of heat sink extensions and the second row of heat sink extensions at least partially interleaved.

In accordance with yet another aspect of the present invention, a method for assembly a memory part that includes a dual inline memory module and two heat sinks is described. First of all, a PCB is provided. A first plurality of memory packages and a second plurality of memory packages are attached respectively to a first side and a second side of the PCB. A first heat sink base having a first row of heat sink extensions is thermally coupled to the first plurality of memory packages, whereas a second heat sink base having a second row of heat sink extensions is thermally coupled to the second plurality of memory packages.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 3A:
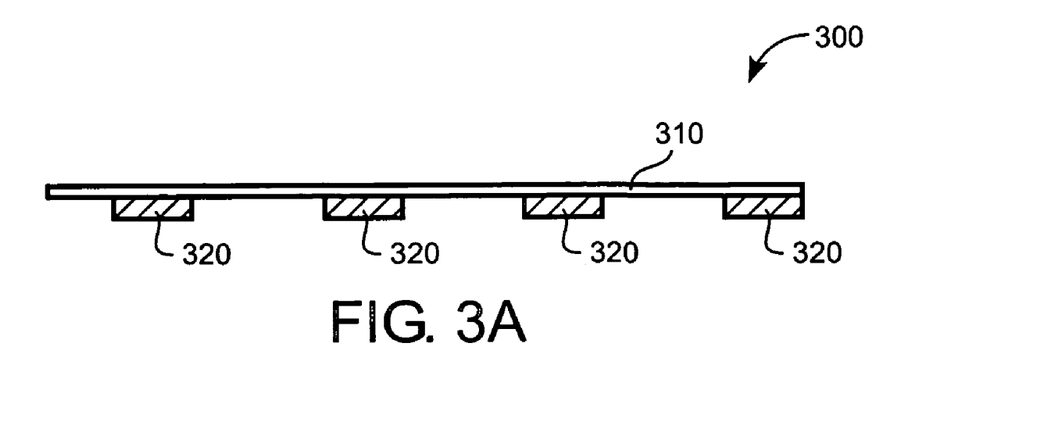
FIG. 3(a)–(c) illustrate respectively a top view, a front view, and a side view of a heat sink with discrete heat sink extensions in accordance with one embodiment of the present invention.
Figure 3B:
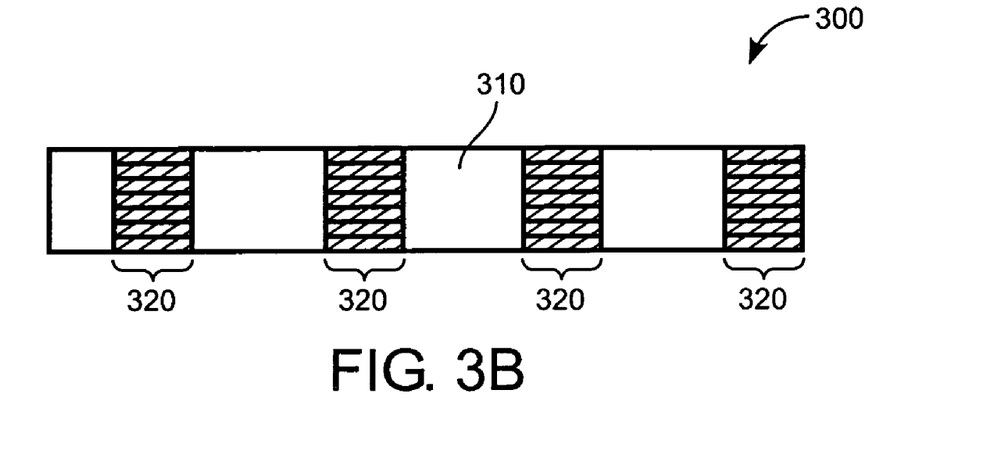
Figure 3C:
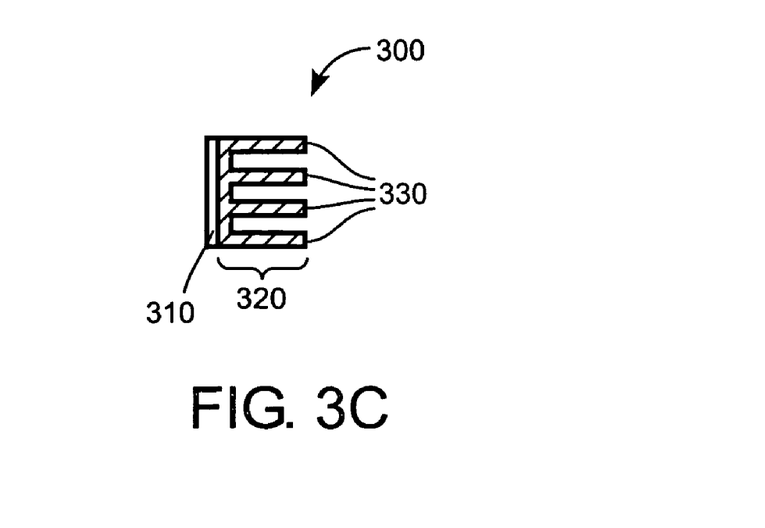

FIG. 3(a) is a top view of a heat sink 300 in accordance with one embodiment of the present invention. The heat sink 300 comprises a heat sink base 310 and four discrete heat sink extensions 320. The four discrete heat sink extensions 320 can be either attached to the heat sink base 310 or forged from the heat sink base 310. FIG. 3(b) is a front view of the heat sink 300, whereas FIG. 3(c) is a side view of the heat sink 300. As illustrated in FIG. 3(c), each heat sink extension 320 includes four heat sink sub-extensions 330 that are extended perpendicularly from the back surface of each heat sink extension 320 and connected together at the back surface of each heat sink extension 320. Each heat sink sub-extension 330 of each heat sink extension 320 is a plate fin. It should be understood that the illustration of four heat sink extensions 320 is only an example, and fewer or more heat sink extensions 320 may be formed, depending on the size of the heat sink base 310 and the size of each heat sink extension 320.

Figure 4:
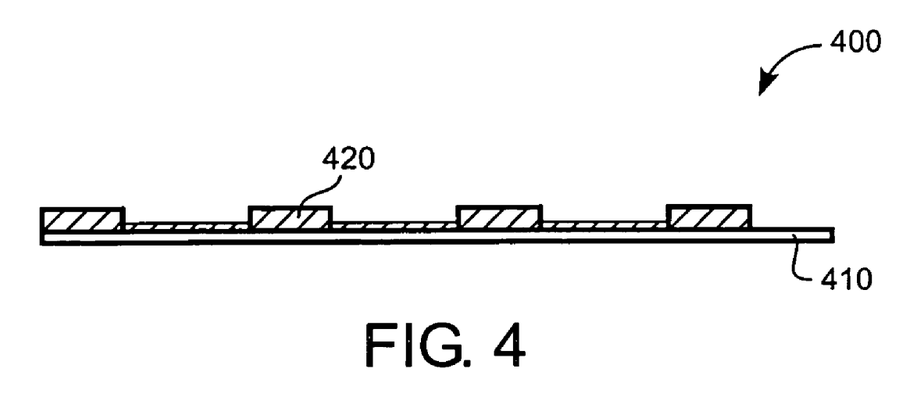
FIG. 4 illustrates a top view of a heat sink with connected heat sink extensions in accordance with one embodiment of the present invention.

FIG. 4 shows a top view of a heat sink 400 in accordance with one embodiment of the present invention. As shown, the heat sink 400 comprises a heat sink base 410 to which four connected heat sink extensions 420 are attached. The back surface of each heat sink extension 420 is extended along the heat sink base 410 and connected with back surfaces of adjacent heat sink extensions 420.

It is desired to have the heat sink 300 and the heat sink 400 made from thermally conductive materials. In one embodiment, the heat sink extensions 320 and 420 are made from a thermally conductive material, and in one example the thermally conductive materials can have a heat transfer coefficient that is greater than about 30 watts per meter per degree Kelvin (W/m°K). In another embodiment, the heat sink bases 310 and 410 could be made from a thermally conductive material that has a heat transfer coefficient of about 200 W/m°K or more. The heat sink extensions 320 and 420 could be made from a high thermal conductive material selected from graphites and metals and alloys. In still another example, the material can be a plastic, such as a liquid crystal polymer. The heat sink bases 310 and 410 could be made from a thermally conductive material selected from graphite, graphite composite, and metallic materials such as aluminum or copper alloy. Of course, the exemplary thermal conductive materials and high thermal conductive materials are not intended to be exhaustive or to limit the invention to the precise materials disclosed. As long as the material provides sufficient thermal conductivity, such material will function in the designs of the invention.

Figure 5A:
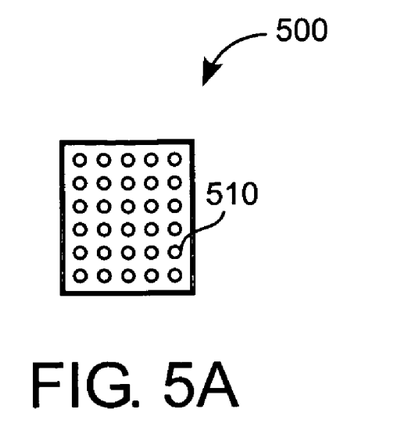
FIG. 5(a)–(c) illustrate front views of a heat sink extension of a heat sink with different heat sink sub-extension designs in accordance with one embodiment of the present invention.
Figure 5B:
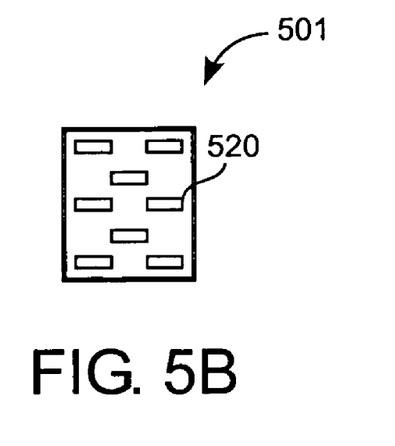
Figure 5C:
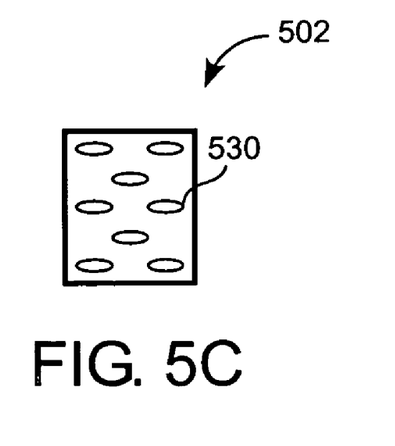

The heat sink bases 310 and 410 are thin layers with mechanical rigidity. In one embodiment, each of the heat sink bases 310 and 410 has a thickness of between about 0.5 mm to about 4 mm. Of course, these measurements are only examples to illustrate the embodiments of the claimed invention. FIG. 5(a)–(c) are front views of a heat sink extension of a heat sink with different heat sink sub-extension designs in accordance with one embodiment of the present invention. The heat sink extension and its heat sink sub-extensions should be of a design that would minimize the airflow resistance through an air channel between two memory modules. Each of the heat sink sub-extensions of a heat sink extension could be a pin, a fin, and a pin-fin. In one embodiment, the heat sink sub-extensions of a heat sink extension are parallel with each other. In another embodiment, the heat sink sub-extensions of a heat sink extension are extended perpendicularly from the back surface of the heat sink extension. In FIG. 5(a), each of heat sink sub-extension 510 of the heat sink extension 500 is a pin. In FIG. 5(b), each of heat sink sub-extension 520 of the heat sink extension 501 is a plate pin-fin. In FIG. 5(c), each of heat sink sub-extension 530 of the heat sink extension 502 is an elliptical pin-fin.

Figure 6A:
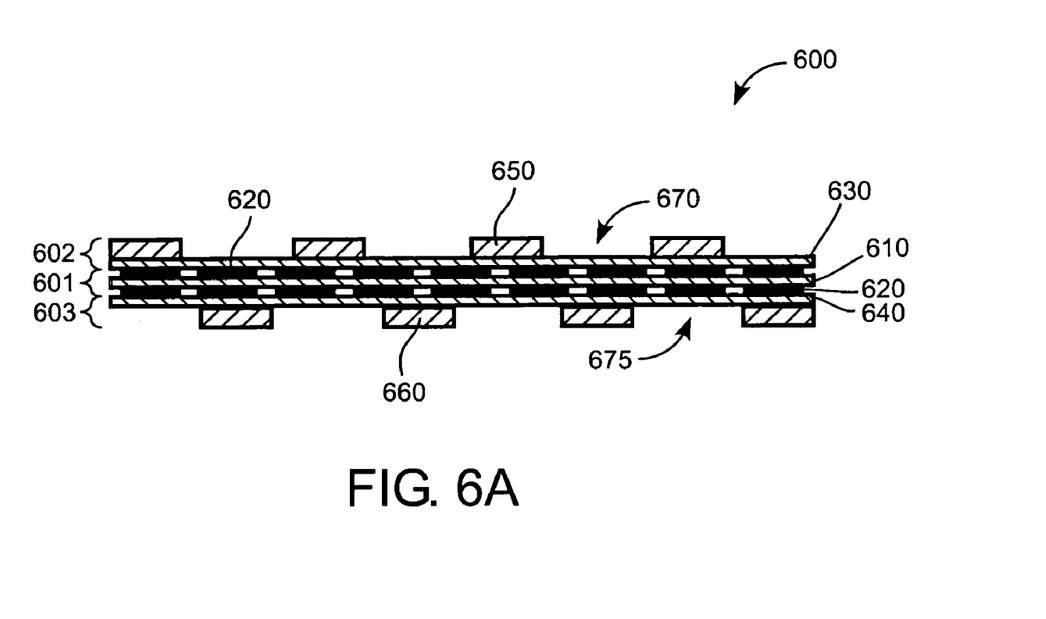
FIG. 6(a) illustrates a top view of a memory part in accordance with one embodiment of the present invention.
Figure 6B:
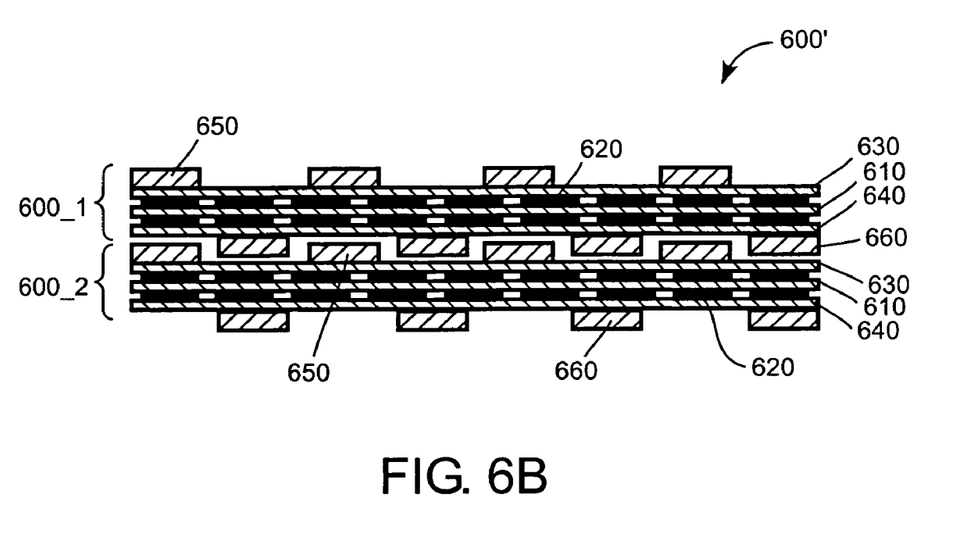
FIG. 6(b) illustrates a top view of an interleaved heat sink structure in accordance with one embodiment of the present invention.
Figure 6C:
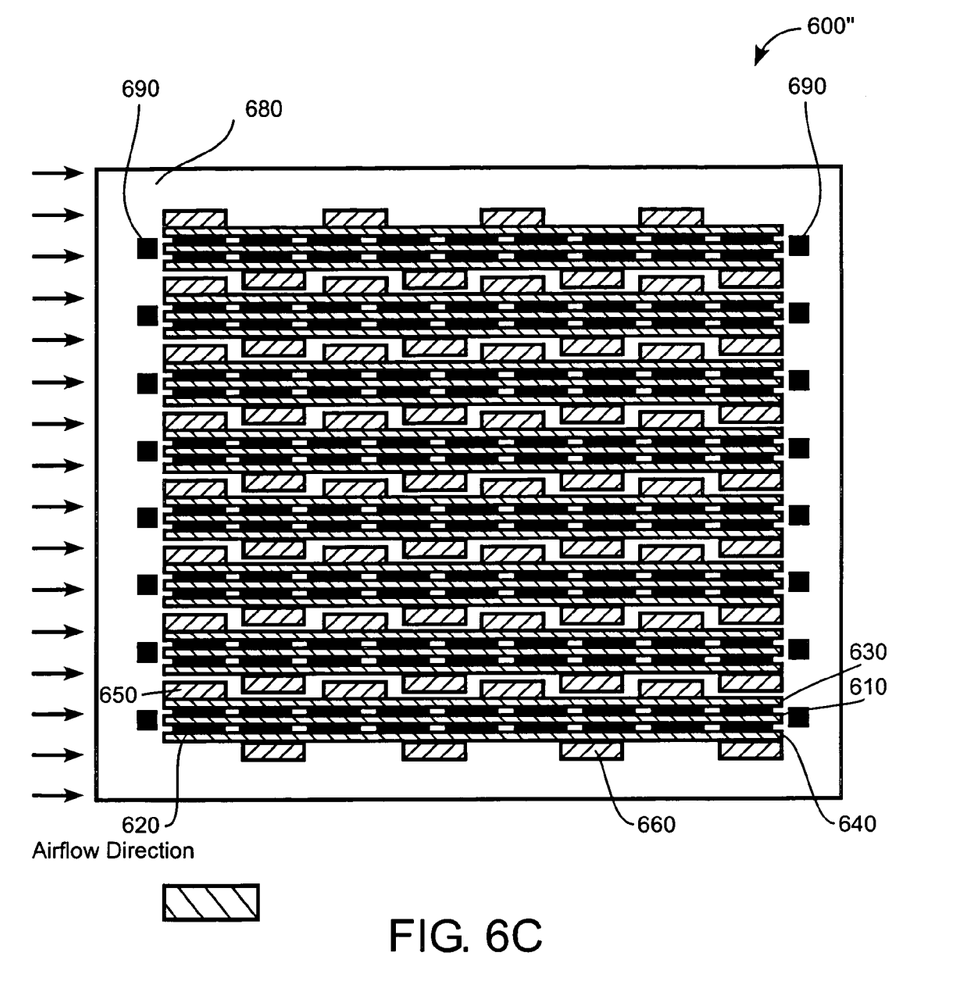
FIG. 6(c) illustrates a top view of a memory heat dissipation control system in accordance with one embodiment of the present invention.
Figure 6D:
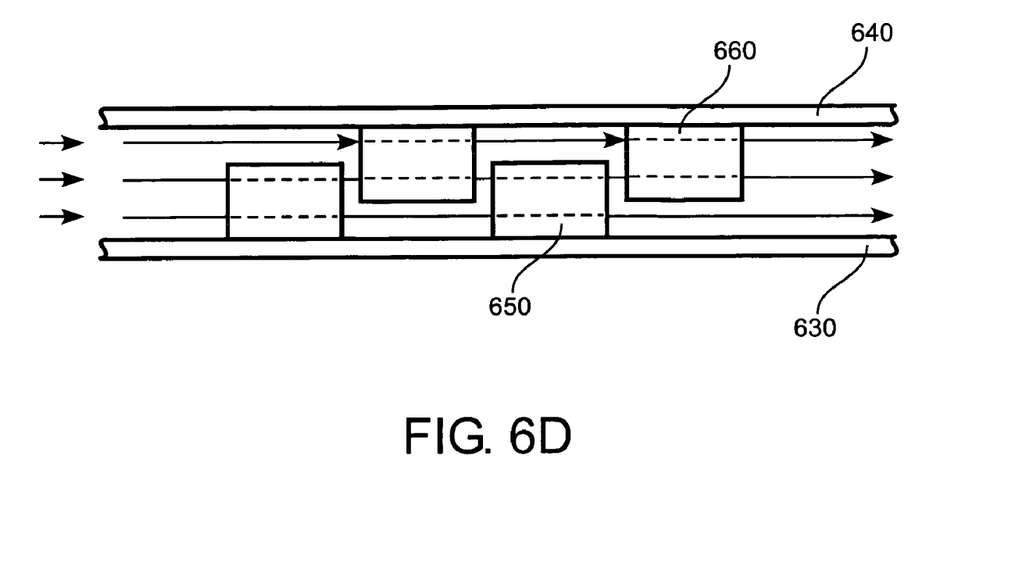
FIG. 6(d) shows the airflow directions between two interleaved heat sinks in accordance with one embodiment of the present invention.

FIG. 6(a) shows a top view of a memory part 600 in accordance with one embodiment of the present invention. The memory part 600 comprises A DIMM 601 and two heat sinks 602 and 603. The DIMM 601 includes a PCB 610 with two sides to each of which a plurality of memory packages 620 is attached. The heat sink 602 includes a heat sink base 630 and a top row of heat sink extensions 650, while the heat sink 603 includes a heat sink base 640 and a bottom row of heat sink extensions 660. The heat sink base 630 and the heat sink base 640 of the memory part 600 are coupled thermally to the surfaces of memory packages 620 on both sides of the PCB 610. The top row of heat sink extensions 650 and the bottom row of heat sink extensions 660 are attached to the heat sink base 630 and the heat sink base 640, respectively. As shown, the top row of heat sink extensions 650 offsets the bottom row of heat sink extensions 660. Each heat sink extensions of the top row 650 and the bottom row 660 are discrete with each other. Between each heat sink extensions of the top row 650, there exists a spaced apart gap of the top row 670. Between each heat sink extensions of the bottom row 660, there exists a spaced apart gap of the bottom row 675.

In one example of a DIMM, it may be desired to have its heat sinks designed in a way such that only a single heat sink design is needed for use on both sides of the DIMM. In this embodiment, the heat sink 602 and the heat sink 603 have the identical design. In other designs, custom heat sink designs may be used.

The heat sinks 602 and 603 should be attached to the DIMM 601 such that minimal thermal resistance exists between the memory packages 620 and the heat sinks 602 and 603. The attachment of the heat sinks 602 and 603 to the memory packages 620 could be achieved with a thermal interface material and mechanical retention mechanism such as a clip. Also, the heat sinks 602 and 603 could be attached to the memory packages 620 with a thermal adhesive that would also provide mechanical support for the heat sinks 602 and 603. Furthermore, the heat sinks 602 and 603 could be soldered to the memory packages 620.

FIG. 6(*b*) shows a top view of an interleaved heat sink structure 600' in accordance with one embodiment of the present invention. The interleaved heat sink structure 600' comprises two memory parts 600_1 and 600_2 that are placed parallel with each other. Each of the memory parts 600_1 and 600_2 includes a DIMM with two heat sinks. The heat sinks have identical design such that the heat sink used on one side of the DIMM could be rotated 180 degrees and used on the other side of the DIMM and still achieve proper interleaving with the heat sink of an adjacent memory part. As shown, the top row of heat sink extensions 650 of the memory part 600_2 interleaves with the bottom row of heat sink extension 660 of the memory part 600_1. Selected ones of the top row of heat sink extensions 650 of the memory part 600_2 are adjacent to selected ones of the bottom row of heat sink extensions 660 of the memory part 600_1. Selected ones of the top row of heat sink extensions 650 of the memory part 600_2 reside at least partially within the spaced apart gap of the bottom row 675 of the memory part 600_1, and selected ones of the bottom row of heat sink extensions 660 of the memory part 600_1 reside at least partially within the spaced apart gap of the top row 670 of the memory part 600_2.

FIG. 6(*c*) is a top view of a memory heat dissipation control system 600" in accordance with one embodiment of the present invention. The memory heat dissipation control system 600" includes eight memory parts arranged in rows on a host board 680. Each memory part is received by a pair of connectors 690. The adjacent memory parts have their top row of heat sink extensions and the bottom row of heat sink extensions interleaved in such a way that allow individual servicing, such as vertical injection and ejection, of a memory part without the need to remove the heat sinks attached to the memory part or its adjacent memory part. The interleaved arrangement between two adjacent memory parts allow memory packages 620 of each memory part to utilize more efficient thermal path that has higher velocity airflow in the center of the channel, and also achieve a denser memory placement. The arrows in FIG. 6(*c*) indicate the airflow directions.

FIG. 6(*d*) shows the airflow directions between two interleaved heat sinks in accordance with one embodiment of the present invention. Due to the intervals (e.g., separations) between discrete heat sink sub-extensions, the airflow will pass through the heat sink extensions 650 and 660.

One feature of the present invention is that the heat sink bases of each memory part can extend beyond the physical dimension of the memory packages at one side of a PCB, allowing for greater utilization of air-cooling in areas that extend beyond the memory packages themselves. An additional feature of the present invention is that the heat sink extensions of a memory part could reduce the thermal resistance between the memory part and the air temperature, thus reducing the required airspeed in the air channel between two adjacent memory parts to achieve the same memory temperature. Thus, the power required for the air moving system is reduced, which saves energy for the computing system at where the memory parts reside.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. An interleaved heat sink structure for dissipating heat from memory, comprising:

a first row of heat sink extensions, each heat sink extension of the first row is spaced apart from each other and is coupled to a first heat sink base, the first heat sink base being thermally coupled to a first plurality of memory packages that are arranged along the first row; and a second row of heat sink extensions, each heat sink extension of the second row is spaced apart from each other and is coupled to a second heat sink base, the second heat sink base being thermally coupled to a second plurality of memory packages that are arranged along the second row, wherein each heat sink extension of the first row of heat sink extensions is parallel to and at least partially interleaved with each heat sink extension of the second row of heat sink extensions and heat sink extensions of the first row being spaced apart from heat sink extensions of the second row and selected heat sink extensions of the first row are adjacent to selected heat sink extensions of the second row.

2. The interleaved heat sink structure for dissipating heat from memory as recited in claim 1, wherein a first spaced apart gap is defined between each heat sink extension of the first row and a second spaced apart gap is defined between each heat sink extension of the second row, and the first row is oriented parallel to the second row and selected heat sink extensions of the first row reside at least partially within the second spaced apart gap, and selected heat sink extensions of the second row reside at least partially within the first spaced apart gap.

3. The interleaved heat sink structure for dissipating heat from memory as recited in claim 1, wherein each of the first heat sink base and the second heat sink base has a thickness of between about 0.5 mm to about 4 mm.

4. The interleaved heat sink structure for dissipating heat from memory as recited in claim 1, wherein the first heat sink base and the second heat sink base are thermally soldered respectively to the first plurality of memory packages and the second plurality of memory packages.

5. The interleaved heat sink structure for dissipating heat from memory as recited in claim 1, wherein the first heat sink base and the second heat sink base are thermally coupled respectively to the first plurality of memory packages and the second plurality of memory packages through a thermal interface material.

6. The interleaved heat sink structure for dissipating heat from memory as recited in claim 5, wherein the first heat sink base and the second heat sink base are further coupled respectively to the first plurality of memory packages and the second plurality of memory packages through mechanical retention mechanism.

7. The interleaved heat sink structure for dissipating heat from memory as recited in claim 1, wherein the first heat sink base and the second heat sink base are thermally coupled respectively to the first plurality of memory packages and the second plurality of memory packages through a thermal adhesive.

8. The interleaved heat sink structure for dissipating heat from memory as recited in claim 1, wherein each heat sink extension of the first row and the second row includes a plurality of heat sink sub-extensions that are extended from a back surface of each heat sink extension of the first row and the second row and are connected together at the back surface of each heat sink extension of the first row and the second row.

9. The interleaved heat sink structure for dissipating heat from memory as recited in claim 8, wherein each heat sink sub-extension of each heat sink extension of the first row and the second row is extended perpendicular from the back surface of each heat sink extension of the first row and the second row.

10. The interleaved heat sink structure for dissipating heat from memory as recited in claim 8, wherein each heat sink sub-extension of each heat sink extension of the first row and the second row is defined parallel with each other.

11. The interleaved heat sink structure for dissipating heat from memory as recited in claim 8, wherein each heat sink sub-extension of each heat sink extension of the first row and the second row is a pin.

12. The interleaved heat sink structure for dissipating heat from memory as recited in claim 8, wherein each heat sink sub-extension of each heat sink extension of the first row and the second row is a fin.

13. The interleaved heat sink structure for dissipating heat from memory as recited in claim 12, wherein the fin is a plate fin.

14. The interleaved heat sink structure for dissipating heat from memory as recited in claim 12, wherein the fin is an elliptical fin.

15. The interleaved heat sink structure for dissipating heat from memory as recited in claim 8, wherein each heat sink sub-extension of each heat sink extension of the first row and the second row is a pin-fin.

16. The interleaved heat sink structure for dissipating heat from memory as recited in claim 15, wherein the pin-fin is an elliptical pin-fin.

17. The interleaved heat sink structure for dissipating heat from memory as recited in claim 15, wherein the pin-fin is a plate pin-fin.

18. The interleaved heat sink structure for dissipating heat from memory as recited in claim 1, wherein each heat sink extension of the first row and the second row is made from a high thermally conductive material.

19. The interleaved heat sink structure for dissipating heat from memory as recited in claim 18, wherein the high thermally conductive material has a heat transfer coefficient that is greater than about 30 W/m°K.

20. The interleaved heat sink structure for dissipating heat from memory as recited in claim 18, wherein the high thermally conductive material is one of graphite, metallic material, and plastic.

21. The interleaved heat sink structure for dissipating heat from memory as recited in claim 1, wherein each heat sink base is defined from a thermally conductive material.

22. The interleaved heat sink structure for dissipating heat from memory as recited in claim 21, wherein the thermally conductive material has a heat transfer coefficient that is equal or greater than about 200 W/m°K.

23. The interleaved heat sink structure for dissipating heat from memory as recited in claim 21, wherein the thermally conductive material is one of graphite, graphite composite, and metallic material.

24. The interleaved heat sink structure for dissipating heat from memory as recited in claim 23, wherein the metallic material is copper alloy or aluminum.

25. The interleaved heat sink structure for dissipating heat from memory as recited in claim 1, wherein each heat sink extension of the first row and the second row is discrete with each other.

26. The interleaved heat sink structure for dissipating heat from memory as recited in claim 1, wherein a back surface of each heat sink extension of the first row is extended along the first heat sink base and connected with back surfaces of adjacent heat sink extensions of the first row, and a back surface of each heat sink extension of the second row is extended along the second heat sink base and connected with back surfaces of adjacent heat sink extensions of the second row.

* * * * *